United States Patent
Perner (10) Patent No.: US 6,728,153 B2
(45) Date of Patent: Apr. 27, 2004

(54) MAGNETIC MEMORY WHICH COMPARES FIRST MEMORY CELL DATA BITS AND SECOND DATA BITS

(75) Inventor: Frederick A. Perner, Palto Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/223,490

(22) Filed: Aug. 19, 2002

(65) Prior Publication Data

US 2004/0032777 A1 Feb. 19, 2004

(51) Int. Cl.[7] .............................................. G11C 7/02
(52) U.S. Cl. .................................. 365/209; 365/189.07
(58) Field of Search ............................ 365/209, 189.07

(56) References Cited

U.S. PATENT DOCUMENTS

| | | | |
|---|---|---|---|
| 4,064,494 A | 12/1977 | Dickson et al. | 365/49 |
| 4,805,093 A | 2/1989 | Ward | 711/108 |
| 6,052,302 A * | 4/2000 | Moyer et al. | 365/173 |
| 6,191,973 B1 | 2/2001 | Moyer | 365/173 |
| 6,249,878 B1 * | 6/2001 | MacLellan et al. | 714/6 |
| 6,269,016 B1 | 7/2001 | Moyer | 365/49 |
| 6,341,079 B1 | 1/2002 | Chadwick | 711/108 |
| 6,374,325 B1 | 4/2002 | Simpson et al. | 711/108 |
| 6,374,326 B1 | 4/2002 | Kansal et al. | 711/108 |

* cited by examiner

Primary Examiner—M. Tran (57) ABSTRACT

A magnetic memory includes memory cells configured to store first data bits. Compare logic is configured to compare the first data bits to second data bits and provide an indication for each first data bit that has a same logic state as a corresponding second data bit.

27 Claims, 6 Drawing Sheets

MAGNETIC MEMORY WHICH COMPARES FIRST MEMORY CELL DATA BITS AND SECOND DATA BITS

THE FIELD OF THE INVENTION

The present invention generally relates to the field of magnetic memories. More particularly, the present invention relates to comparing first data bits stored in memory cells to second data bits and providing an indication if each one of the first data bits has a same logic state as a corresponding one of the second data bits.

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations are referred to as "parallel" and "anti-parallel" orientations. With parallel orientation, the orientation of magnetization in the data storage layer is substantially parallel to the magnetization in the reference layer along the easy axis and the magnetic memory cell is in a low resistance state which can be represented by the value R. With anti-parallel orientation, the orientation of magnetization in the data storage layer is substantially anti-parallel to the magnetization in the reference layer along the easy axis and the magnetic memory cell is in a high resistance state which can be represented by the value R+$\Delta$R. A sense amplifier can be used to sense the resistance state of a selected magnetic memory cell to determine the logic state stored in the memory cell.

Applications for MRAM include replacement of disk drives for portable devices such as small computer systems and personal digital assistants (PDAs). A desirable feature of these devices is the ability to store information which can be efficiently retrieved. One approach used to retrieve the information is to search the memory contents by matching a portion of the desired information. This approach enables the memory to be searched and the data to be retrieved without knowing specific memory address information. Memories which provide this type of searching capability are referred to as content addressable memories (CAMs).

Because of the relatively slow access time of disk drives, the CAM function is typically implemented by a separate memory device. One approach which is used is a CACHE memory. CACHE memories allow searching by matching a portion of the stored information which is stored in a content addressable part of the CACHE memory. The desired data can be returned if it is stored in the CACHE memory, thereby avoiding the longer time required to retrieve the data from the disk drive.

The use of the separate memory components can result in increased power consumption and decreased reliability. Costs can increase because of other components such as memory controllers which may be required to coordinate the data access activities between the separate components.

In view of the above, there is a need for a low power, reliable and cost effective non-volatile memory for CAM applications.

SUMMARY OF THE INVENTION

One aspect of the present invention provides a magnetic memory which includes memory cells configured to store first data bits. Compare logic is configured to compare the first data bits to second data bits and provide an indication for each first data bit that has a same logic state as a corresponding second data bit.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
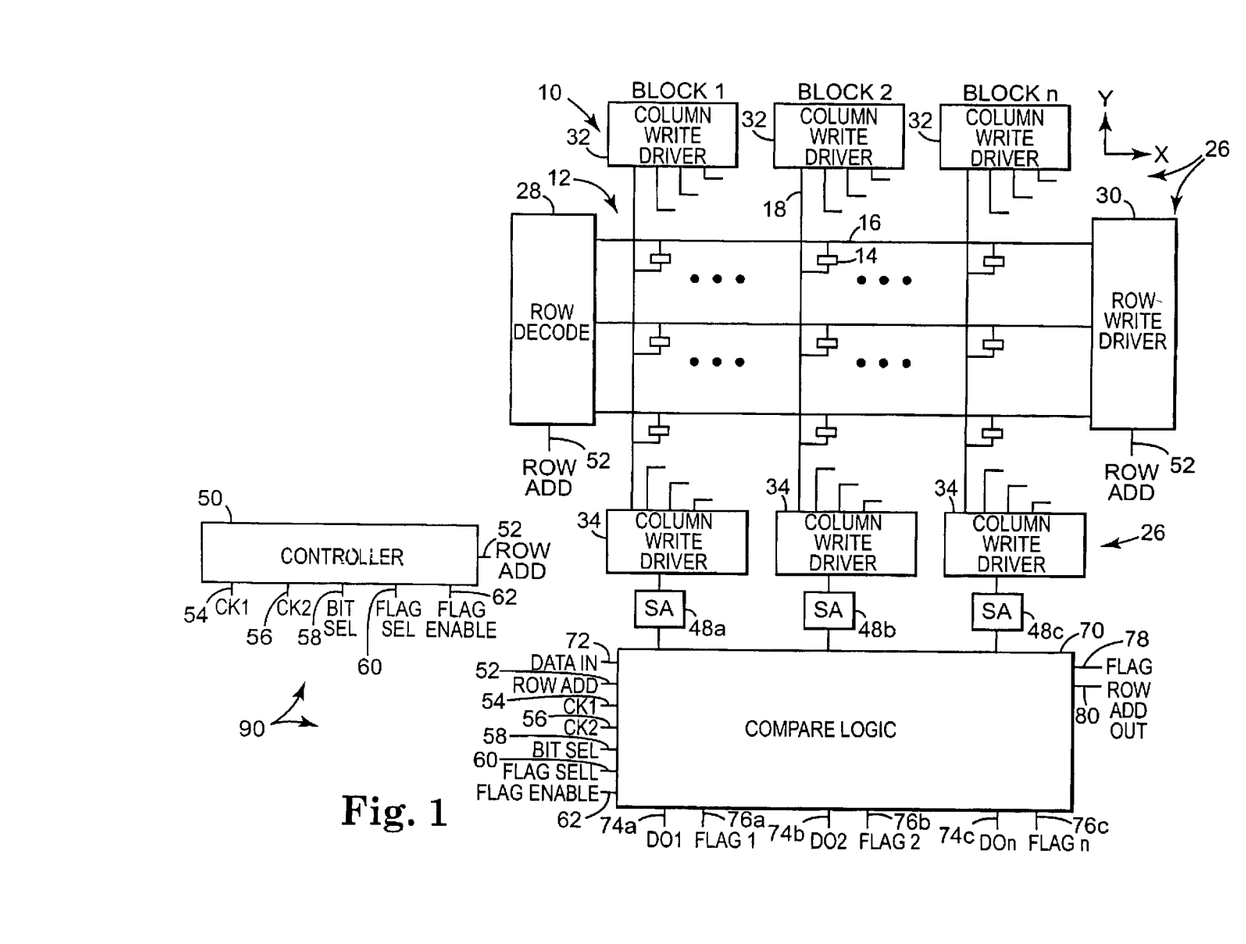
FIG. 1 is a diagram illustrating an exemplary embodiment of a magnetic memory according to the present invention.

FIG. 1 is a diagram illustrating one exemplary embodiment of a magnetic memory 10 according to the present invention. Magnetic memory 10 is a content addressable memory (CAM) and includes at least two memory cells configured to store at least two first data bits. Compare logic is included which is configured to compare the first data bits to at least two second data bits and provide an indication if each one of the first data bits has the same logic state as the corresponding second data bits. In the illustrated embodiment, the first data bits represent data stored in magnetic memory 10 and the second data bits represent "compare" data used to compare with the first data bits to determine if the second data bits are stored in magnetic memory 10. In one embodiment, the indication is an output flag indicating that the first and second data bits are the same and therefore that the compare data is stored in magnetic memory 10. In one embodiment, the indication is a row address which indicates the location of the data in magnetic memory 10. In other embodiments, the indication is other address combinations which include, but are not limited to, multiple row address, row and block addresses or row and bit line addresses.

In the exemplary embodiment illustrated in FIG. 1, magnetic memory 10 includes memory cell blocks which are illustrated as block 1 through block n, where n is any suitable number. The magnetic memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size. In other embodiments, the array 12 can utilize highly parallel modes of operation, such as 64-bit wide or 128-bit wide operation.

In one embodiment, word lines 16 extend along the x-direction in a plane of array 12 and bit lines 18 extend along the y-direction in a plane of array 12. In one embodiment, there is one word line 16 for each row of array 12 and one bit line 18 for each column of array 12. In the embodiment illustrated in FIG. 1, magnetic memory cell 14 is located at an intersection or cross point of a word line 16 and a bit line 18.

The magnetic memory cells 14 are not limited to any particular type of device. Magnetic memory cells 14 may be, for example, spin dependent tunneling ("SDT") junction devices, anisotropic magnetoresistance (AMR) devices, giant magnetoresistance (GMR) devices, colossal magnetoresistance devices, extraordinary magnetoresistance devices or very large magnetoresistance devices.

In one embodiment, magnetic memory 10 includes a write circuit 26. Write circuit 26 includes a row decode circuit 28, row write driver 30, column write drivers 32, and column write drivers 34. Row write driver 30, column write drivers 32 and column write drivers 34 supply write currents Ix and Iy to selected word and bit lines 16 and 18 during a write operation on a selected magnetic memory cell 14. Each pair of column write drivers 32 and 34 supply a bit line write current to a block (i.e., multiple columns) of magnetic memory cells 14. Different pairs of column write drivers 32 and 34 provide bit line currents to different blocks of magnetic memory cells 14. In one embodiment, at any given time the column write drivers 32 and 34 write to a single magnetic memory cell 14 in a block.

In the illustrated embodiment, during a read operation on selected magnetic memory cells 14, row write driver 30 and column write driver 34 supply sense currents to the selected magnetic memory cells 14. Sense amplifiers 48 sense the resistance state of selected magnetic memory cells 14 to determine the logic value stored in the selected magnetic memory cells 14. In one embodiment, sense amplifiers 48 measure the sense current to determine whether the memory cell has a resistance of value R corresponding to one logic state or a value R+ΔR corresponding to a second logic state.

In the illustrated embodiment, a controller 50 is included to control the comparisons of the first data bits and the second data bits. A row address output is included at 52 to provide row addresses to row decode 28, row write driver 30 and compare logic 70. A first clock (CK1) and a second clock (CK2) at 54 and 56 control the compare operations of compare logic 70 and control the loading of the second data bits into compare logic 70. In one embodiment, the second data bits are loaded into compare logic 70 from a source which is external to magnetic memory 10. In various embodiments, these external sources can include microprocessors, memory controllers or other memory storage devices. In the illustrated embodiment, controller 50 includes a bit select output at 58 to control the selection of the first and second data bits which are compared by compare logic 70. A flag select output at 60 is included to control the selections of output flags from comparisons of blocks of the first data bits to the second data bits. A flag enable at 62 enables the output flag at 78 or an output row address at 80.

In the exemplary embodiment, compare logic 70 is configured to store at least two first data bits received from at least two memory cells 14. Compare logic 70 compares on a bit by bit basis the first data bits to at least two second data bits received via data input 72, and provides an indication at flag 78 or row address output 80 if each one of the first data bits has a same logic state as a corresponding one of the second data bits. In one embodiment, data input 72 includes a single input line which allows second data bits to be serially loaded into compare logic 70. In other embodiments, data input 72 includes two or more data input lines. In one embodiment, data input 72 has one data input line for each block of block 1-n of bit lines 18. In the exemplary embodiment, a row address output at 80 is a word line address for the memory cells 14 which store the first data bits. In other embodiments, the address output at 80 provides word line and bit line addresses.

Compare logic 70 provides data outputs 74 for data read from memory cells 14. In one embodiment, data outputs 74a, 74b and 74c each include a data output line for each bit line in each of the blocks 1-n. In other embodiments, data outputs 74a, 74b and 74c are each single data output lines which each correspond to one of the blocks 1-n. Compare logic 70 includes flag outputs at 76 which each correspond to one of the blocks 1-n. The flag outputs for blocks 1, 2 and n are illustrated at 76a, 76b and 76c respectively. In the exemplary embodiment, each flag 76 provides an indication when selected first bits in a particular block have the same logic state as corresponding second data bits.

Figure 2A:
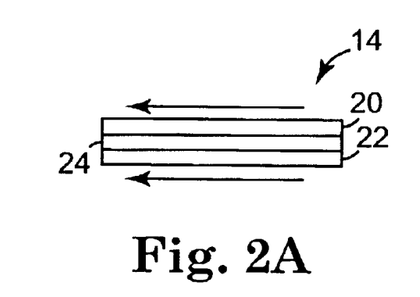
FIGS. 2A and 2B are diagrams illustrating parallel and anti-parallel magnetization of a magnetic memory cell.
Figure 2B:
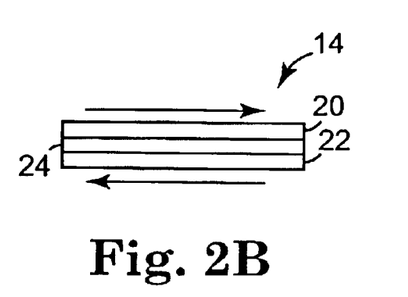

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a "free" layer because it has a magnetization orientation that is not pinned and which can be oriented in either of two directions along the easy axis which lies in a plane. Reference layer 22 is referred to as a "pinned" layer because it has a magnetization that is oriented in a plane but is fixed so as not to rotate in the presence of an applied magnetic field within a range of interest. FIG. 2A illustrates by arrows a "parallel" orientation when the magnetization of the free and pinned layers 20 and 22 are in the same direction. FIG. 2B illustrates by arrows an "anti-parallel" orientation when the magnetization of the free and pinned layers 20 and 22 are in opposite directions.

The insulating tunnel barrier 24 allows quantum mechanical tunneling to occur between the free and pinned layers. This tunneling phenomenon is electron spin dependent, making the resistance of the spin dependent tunneling device a function of the relative orientations of the magnetization of the free and pinned layers 20 and 22. The resistance of magnetic memory cells 14 is a first value R if the orientation of magnetization of the free and pinned layers 20 and 22 is parallel as illustrated in FIG. 2A. The resistance of magnetic memory cell 14 is increased to a second value R+ΔR when the orientation of magnetization is changed from parallel to anti-parallel as illustrated in FIG. 2B.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

Figure 3:
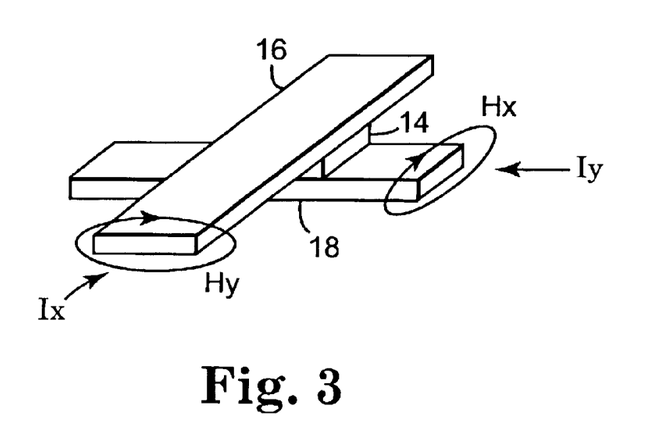
FIG. 3 is a diagram illustrating a magnetic memory cell that has been selected.

FIG. 3 is a diagram illustrating a magnetic memory cell that has been selected. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 causes the magnetization of free layer 20 to rotate from the parallel orientation to the anti-parallel orientation, or to rotate the anti-parallel orientation to the parallel orientation.

In one embodiment, magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 is parallel or anti-parallel as illustrated in FIGS. 2A and 2B.

Figure 4:
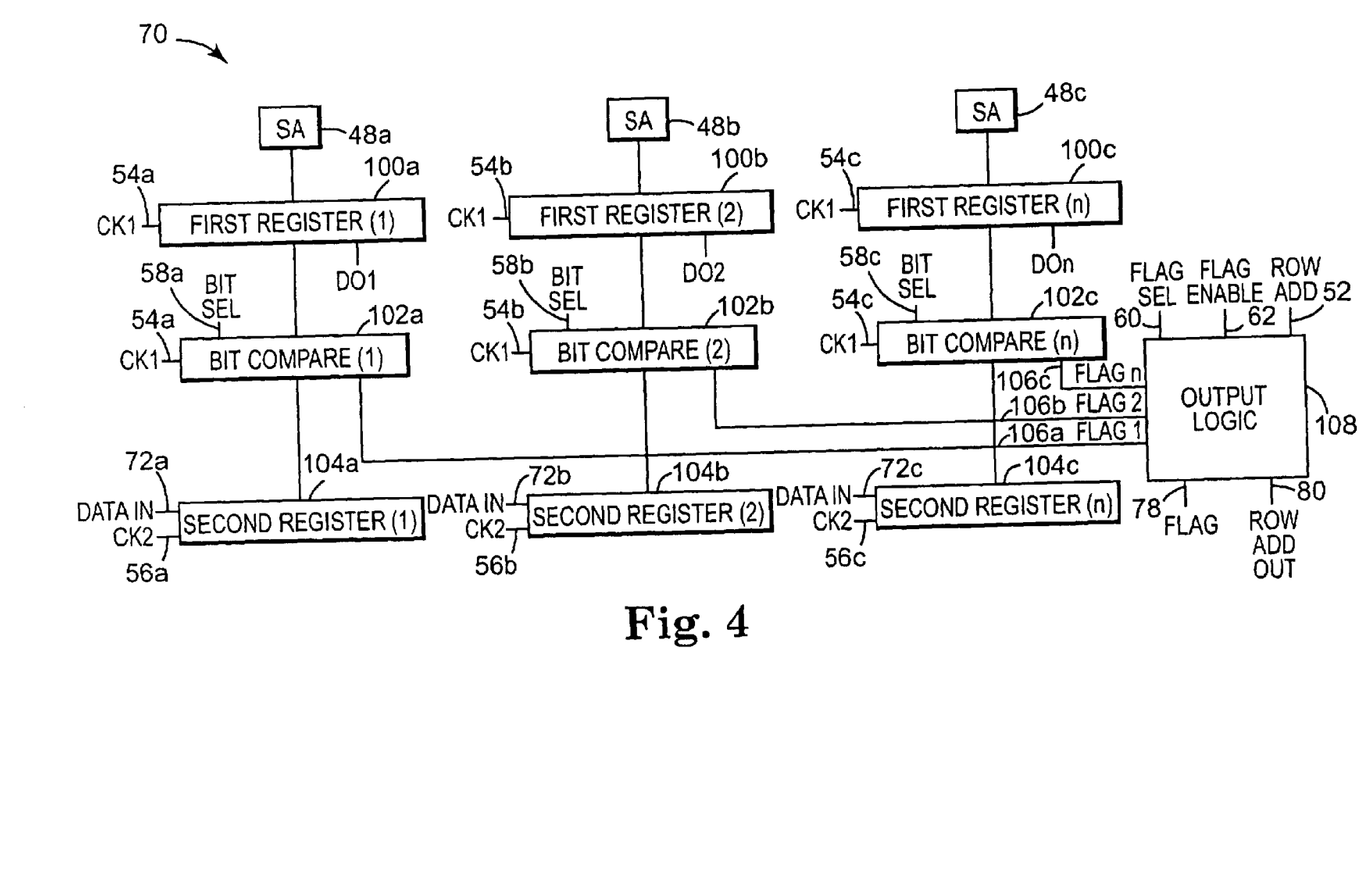
FIG. 4 is a diagram illustrating an exemplary embodiment of compare logic.

FIG. 4 is a diagram illustrating an exemplary embodiment of compare logic 70. Compare logic 70 includes first registers 100, bit compare logic circuits 102, second registers 104 and output logic 108. First registers 100 are coupled to sense amplifiers 48 and store first data bits received from memory cells 14. First registers 100 are controlled by the CK1 clock at 54. In one embodiment, CK1 clock 54a is coupled to first register 100a, CK1 clock 54b is coupled to first register 100b, and CK1 clock 54c is coupled to first register 100c, and each CK1 clock 54 controls the corresponding first register 100. In one embodiment, first register 100a, 100b and 100c are coupled to a single CK1 clock 54. The first data bits are loaded into first registers 100 is from an address location identified by the row address provided by controller 50 at row address output 52. In one embodiment, the data is loaded serially into each first register 100 from sense amplifiers 48. In other embodiments, the data is loaded in parallel into first registers 100.

In the illustrated embodiment, second registers 104 are configured to store second data bits which are compared to the first data bits stored in corresponding first registers 100. Second registers 104 are controlled by the CK2 clock inputs at 56 and store second data bits provided at data input 72. In one embodiment, CK2 clock 56a is coupled to second register 104a, CK2 clock 56b is coupled to second register 104b, and CK2 clock 56c is coupled to second register 104c, each CK2 clock 56 controls the corresponding second register 104. In one embodiment, second register 104a, 104b and 104c are coupled to a single CK2 clock 56.

In one embodiment, data inputs 72a, 72b and 72c are each a single line and data is read serially into each of the second registers 104. In one embodiment, each second register 104 is coupled to one other second register 104 and data is loaded serially into second registers 104a, 104b and 104c via a single input 72a. In other embodiments, other suitable configurations of data inputs 72 are used to load the second data bits into second registers 104.

In the illustrated embodiment, each bit compare logic circuit 102 is controlled by the CK1 clock input at 54 and compares each of the first data bits to the corresponding second data bits. In one embodiment, CK1 clock 54a is coupled to bit compare logic circuit 102a, CK1 clock 54b is coupled to bit compare logic circuit 102b, and CK1 clock 54c is coupled to bit compare logic circuit 102c, and each CK1 clock 54 controls the corresponding bit compare logic circuit 102. In one embodiment, bit compare logic circuits 102a, 102b and 102c are coupled to a single CK1 clock 54.

In the illustrated embodiment, each bit compare logic circuit 102 provides a first logic output for each of the first data bits which have the same logic state as a corresponding second data bit or provides a second logic output for each of the first data bits which do not have same logic state as the corresponding second data bit. In one embodiment, a first logic output is a logic "1" and a second logic output is a logic "0". In another embodiment, the first logic output is a logic "0" and the second logic output is a logic "1". Each bit compare logic circuit 102 provides an indication at 106 if all of the bit comparisons of the first data bits to the corresponding second data bits provide the first logic output. In one embodiment, the indication are output flags at 106 which indicate that all of the first data bits have the same logic state as the corresponding second data bits.

In the illustrated embodiment, output logic 108 is included. Output logic 108 has a flag select input at 60, a flag enable input at 62, and a row address input at 52. Controller 50 selects at least one of the flags 1-n via flag select input 60. Flag enable input 62 enables output logic 108 to provide a flag output at 78 if all of the selected flags at 106 are providing the indications. Output logic 108 couples the row address at 52 to the row address output at 80 when the flag output is provided at 78. In one embodiment, the indication is a logical "1" provided at flag output 78. In one embodiment, the indication is a logical "0" provided at flag output 78.

Figure 5:
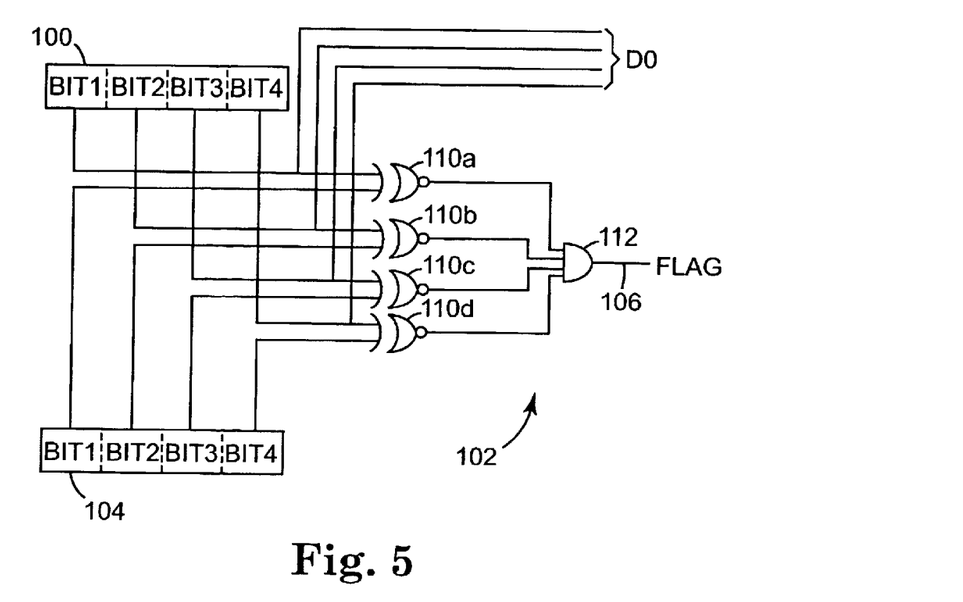
FIG. 5 is a diagram illustrating a first exemplary embodiment of bit compare logic.

FIG. 5 is a diagram illustrating a first exemplary embodiment of bit compare logic circuit 102. FIG. 5 illustrates a first register 100 configured to store the first data bits which, in the first exemplary embodiment, are illustrated as bit 1, bit 2, bit 3 and bit 4. Although only four bits are illustrated, in other embodiments, other suitable numbers of bits can be stored in each first register 100. The second register 104 is configured to store the second data bits which correspond to the first data bits and which are illustrated in the first exemplary embodiment as bit 1, bit 2, bit 3 and bit 4. In other embodiments, other suitable numbers of bits can be stored in each second register 104.

In the first exemplary embodiment, EXCLUSIVE NOR gates 110 are coupled to first register 100 and second register 104 and compare each one of the first data bits in first register 100 to corresponding second data bits stored in second register 104. EXCLUSIVE NOR gates 110 provide a first logic output for each one of the first data bits which have the same logic state as the corresponding one of the second data bits or provide the second logic output for each one of the first data bits which does not have the same logic state as the corresponding one of the second data bits. In the first exemplary embodiment, the first logic output is a logic "1" and the second logic output is a logic "0". In other embodiments, the first logic output is a logic "0" and the second logic output is a logic "1".

In the first exemplary embodiment, AND logic gate 112 is coupled to EXCLUSIVE NOR logic gates 110 and is configured to provide an output indication signal at 106 if all of the EXCLUSIVE NOR logic gates 110 are providing the first logic output. The indication provided at line 106 is an output flag which has the first logic output when all of the bits in first register 100 and the corresponding bits in second register 104 have the same logic state. Thus EXCLUSIVE NOR logic gate 110a compares bit 1 in first register 100 to the corresponding bit 1 in second register 104. If bit 1 in first register 100 and bit 1 in second register 104 both have the same logic state, either a logic "1" or a logic "0", the output of EXCLUSIVE NOR logic gate 110a is the first logic output which in the first exemplary embodiment is a logic "1". Similarly, if bit 2 in first register 100 and bit 2 in second register 104, bit 3 in first register 100 and bit 3 in second register 104, and bit 4 in first register 100 and bit 4 in second register 104, each respectively have the same logic state, either a logic "1" or a logic "0", EXCLUSIVE NOR logic gates 110b, 110c and 110c will all be providing the first logic output. In the first exemplary embodiment, when all EXCLUSIVE NOR logic gates 110a through 110d are providing the first logic output, AND logic gate 112 provides the indication or output flag at 106.

In the first exemplary embodiment, the data output is illustrated at DO provides a separate data output for each bit stored in first register 100. In another embodiment, each first data register 100 has a single serial data output and the contents of first register 100 are serially clocked out of first register 100.

In a first exemplary method to determine if data is stored in magnetic memory 10, at least two first data bits which are stored in at least two memory cells 14 are compared to two second data bits. An indication is provided if each of the first data bits has the same logic state as the corresponding one of the second data bits.

In a second exemplary method, at least two first data bit are read from at least two memory cells and are stored in first register 100. At least two second data bits are stored in second register 104. Each of the first data bits in first register 100 is compared to the corresponding second data bits in second register 104. A first logic output is provided for each corresponding first and second data bits which have the same logic state and a second logic output is provided for each corresponding first and second logic bits which do not have the same logic state.

Figure 6:
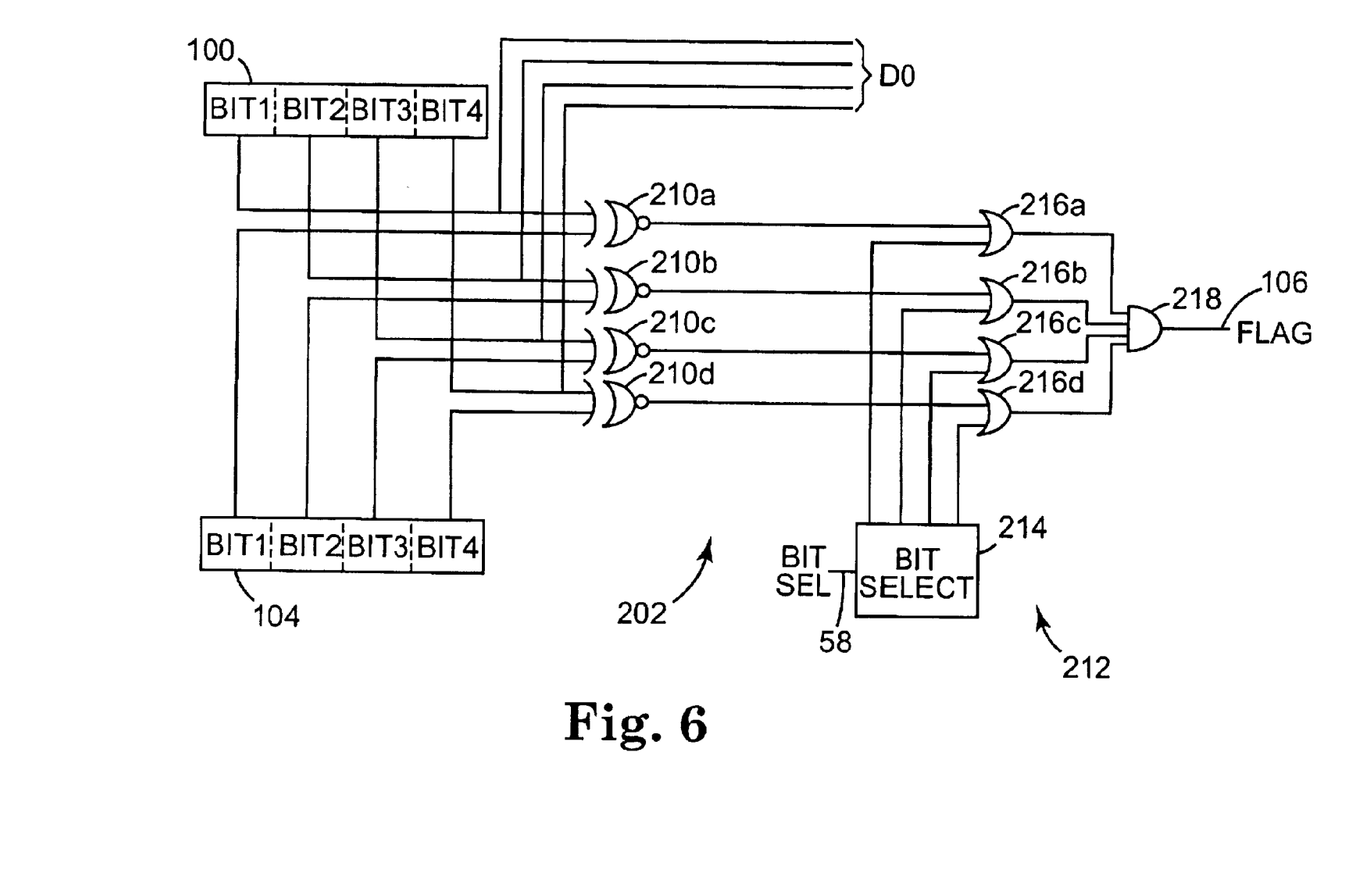
FIG. 6 is a diagram illustrating a second exemplary embodiment of bit compare logic.

FIG. 6 is a diagram illustrating a second exemplary embodiment of bit compare logic. The bit compare logic circuit is illustrated at 202. Bit compare logic circuit 202 is similar to bit select logic 102 but includes bit select logic 212 to select corresponding bits in first register 100 and second register 104 which are compared to generate the output indication or flag at 106.

In the second exemplary embodiment, compare logic 202 includes EXCLUSIVE NOR logic gates 210 which are coupled to first register 100 and second register 104. Each EXCLUSIVE NOR logic gate compares a first data bit in first register 100 to a corresponding second data bit in second register 104 and provides the first logic output if the first data bit has the same logic state as the corresponding second data bit, and provides a second logic output if the first data bit does not have the same logic state as a corresponding second data bit. In the second exemplary embodiment, the first logic output is a logic "1" and the second logic output is a logic "0". In other embodiments, the first logic output is a logic "0" and the second logic output is a logic "1".

In the second exemplary embodiment, bit select logic 212 selects at least one EXCLUSIVE NOR logic gate 210 to provide the first or second logic output to AND logic gate 218. Bit select logic 214 is coupled to controller 50 via bit select line 58 and controller 50 selects EXCLUSIVE NOR logic gates 210 by setting corresponding inputs at OR logic gates 216 at a logic "0". This enables OR logic gates 216 to act as pass through gates and pass the output of EXCLUSIVE NOR logic gates 210 to AND gate 218. EXCLUSIVE NOR logic gates 210 which are not selected have corresponding inputs at OR logic gates 216 set by bit select logic 214 to a logic "1". Because AND logic gate 106 provides the output indication or flag when all outputs of OR logic gates 216 are at a logic "1", the output indication or flag is provided at 106 when all of the selected EXCLUSIVE NOR logic gates 210 are providing the first logic output.

In the second exemplary embodiment, the data output is illustrated at DO provides a separate data output for each bit stored in first register 100. In another embodiment, each first data register 100 has a signal serial data output and the contents of first register 100 is serially clocked out of first register 100.

Figure 7:
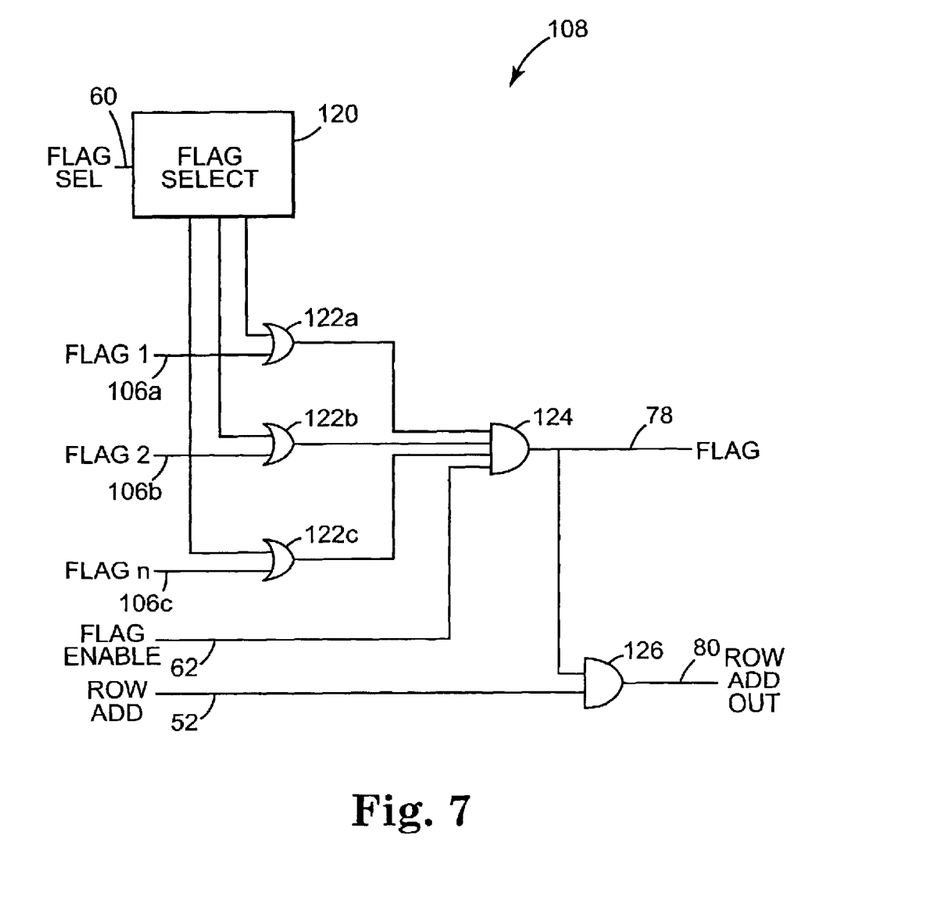
FIG. 7 is a diagram illustrating an exemplary embodiment of output logic.

FIG. 7 is a diagram illustrating an exemplary embodiment of output logic. The output logic 108 is configured to select at least one of the bit compare logic circuits 102 and provide an output indication or flag if the selected bit compare logic circuits 102 are providing a first logic output. Flag select logic 212 selects at least one bit compare logic circuit 102 to provide the first or second logic output to AND logic gate 124. Flag select logic 120 is coupled to controller 50 via flag select line 60 and controller 50 selects bit compare logic circuits 102 by setting corresponding inputs at OR logic gates 122 at a logic "0". This enables OR logic gates 122 to act as pass through gates and pass the output of bit compare logic circuits 102 to AND gate 124. Bit compare logic circuits 102 which are not selected have corresponding inputs at OR logic gates 122 set by flag select logic 120 at a logic "1". Because AND logic gate 124 provides the output indication or flag when all outputs of OR logic gates 122 are at a logic "1", the output indication or flag is provided at 78 when all of the selected bit compare logic circuits 102 are providing the first logic output. AND logic gate 124 is coupled to controller 50 via flag enable line 62 which enables AND logic gate 124 to provide the output indication or flag at 78.

In the exemplary embodiment, AND logic gate 126 is coupled to the row address output 52 of controller 50. AND logic gate 126 is also coupled to the output of AND logic gate 124 at 78 and provides the row address at an output 80 when AND logic gate 124 is providing the output indication or flag at 78. In one embodiment, row address line 52 is a single data line and the row address is serially coupled to the row address output at 80. In one embodiment, row address line 52 includes a suitable number of individual address lines which are each coupled to an input of an AND logic gate. Each AND logic gate has a second input coupled to the output of AND logic gate 124 at 78 and the row address is coupled in parallel to a suitable number of corresponding row address output lines at 80 when AND logic gate 124 is providing the output indication or flag at 78.

In a third exemplary method, at least one of the at least two first data bits from at least two memory cells 14 is stored in each first register 100. At least one of the at least two second data bits are stored in each second register 104. In each corresponding first register 100 and second register 104, each first data bit is compared to a corresponding second data bit. A first logic output is provided for each corresponding first and second registers 100 and 104 in which all first data bits have the same logic states as corresponding second data bits, and a second logic output is provided for each corresponding first and second registers 100 and 104 in which all first data bits do not have the same logic states as corresponding second data bits. At least one of the corresponding first and second registers 100 and 104 are selected and the indication is provided at 78 if the selected corresponding first and second registers 100 and 104 are providing the first logic output. In one embodiment, the indication is an output flag. In one embodiment, the indication is a word line or row address for the memory cells 14 from which the first data bits were read from.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory comprising:
   memory cells configured to store first data bits; and
   compare logic configured to compare the first data bits to second data bits and provide an indication for each first data bit that has a same logic state as a corresponding second data bit, wherein the compare logic comprises:
   a first register configured to store the first data bits;
   a second register configured to store the second data bits; and
   bit compare logic coupled to the first and second registers, the bit compare logic configured to compare first data bits to corresponding second data bits and provide a first logic output for the first data bits which have the same logic state as the corresponding second data bits and provide a second logic output for the first data bits which do not have the same logic state as the corresponding second data bits.

2. The magnetic memory of claim 1, wherein the bit compare logic is configured to provide the indication if comparisons of the first data bits to the corresponding second data bits are providing the first logic output.

3. A magnetic memory comprising:
   memory cells configured to store first data bits; and
   compare logic configured to compare the first data bits to second data bits and provide an indication for each first data bit that has a same logic state as a corresponding second data bit, wherein the bit compare logic comprises:
   at least two EXCLUSIVE NOR logic gates coupled to the first and second registers, wherein each EXCLUSIVE NOR logic gate is configured to compare the first data bits to the corresponding second data bits and provide the first logic output for the first data bits which have the same logic state as the corresponding second data bits and provide the second logic output for the first data bits which do not have the same logic state as the corresponding second data bits; and
   an AND logic gate coupled to the EXCLUSIVE NOR logic gates configured to provide the indication if all of the EXCLUSIVE NOR logic gates are providing the first logic output.

4. The magnetic memory of claim 3, wherein the indication is an output flag.

5. A magnetic memory comprising:
   memory cells configured to store first data bits; and
   compare logic configured to compare the first data bits to second data bits and provide an indication for each first data bit that has a same logic state as a corresponding second data bit, wherein the compare logic is configured to provide the indication which is an address for the memory cells which are storing the first data bits.

6. The magnetic memory of claim 5, wherein the memory cells storing the first data bits have a same word line address, and wherein the address is the word line address.

7. The magnetic memory of claim 1, wherein the second data bits are loaded into the second register from a source which is external to the magnetic memory.

8. A magnetic memory storage device, comprising:
   an array of memory cells configured to store first data bits;
   an array of word lines which intersects the array of memory cells; and
   compare logic configured to compare the first data bits stored in the memory cells which are intersected by a same word line to second data bits and provide an indication for each first data bit that has a same logic state as a corresponding second data bit.

9. The magnetic memory storage device of claim 8, wherein the compare logic comprises:
   a first register configured to store the first data bits;
   a second register configured to store the second data bits; and
   bit compare logic coupled to the first and second registers, the bit compare logic configured to compare first data bits to corresponding second data bits and provide a first logic output for the first data bits which have the same logic state as the corresponding second data bits and provide a second logic output for the first data bits which do not have the same logic state as the corresponding second data bits.

10. The magnetic memory storage device of claim 9, wherein the bit compare logic is configured to select comparisons of the corresponding first and second data bits and provide the indication if the selected comparisons all have the first logic output.

11. The magnetic memory storage device of claim 10, wherein the bit compare logic comprises:
    at least two EXCLUSIVE NOR logic gates coupled to the first and second registers, wherein each EXCLUSIVE NOR logic gate is configured to compare the first data bits to the corresponding second data bits and provide the first logic output for the first data bits which have the same logic state as the corresponding second data bits and provide the second logic output for the first data bits which do not have the same logic state as the corresponding second data bits;

bit select logic configured to select at least one of the EXCLUSIVE NOR logic gates; and an AND logic gate coupled to the bit select logic configured to provide the indication if the selected EXCLUSIVE NOR logic gates are providing the first logic output.

12. The magnetic memory storage device of claim 8, wherein the indication is a word line address for the same word line.

13. The magnetic memory storage device of claim 9, wherein the second data bits are loaded into the second register from a source which is external to the magnetic memory storage device.

14. A content addressable memory, comprising:

an array of memory cells configured to store first data bits;

an array of bit lines extending in a first direction which intersects the array of memory cells;

an array of word lines extending in a second direction which intersects the array of memory cells;

compare logic coupled to the bit lines configured to compare the first data bits stored in the memory cells which are intersected by a same word line to second data bits and provide an indication for each first data bit that has a same logic state as a corresponding second data bit.

15. The content addressable memory of claim 14, wherein the compare logic comprises:

first registers configured to store the first data bits;

second registers configured to store the second data bits; and bit compare logic circuits, wherein each bit compare logic circuit is coupled to a first register and a second register and is configured to compare each first data bit in the first register to a corresponding second data bit in the second register and provide a first logic output if all of the first data bits in the first registers have the same logic state as the corresponding second data bits in the second registers and provide a second logic output if all of the first data bits in the first registers do not have the same logic state as the corresponding second data bits in the second registers.

16. The content addressable memory of claim 15, wherein the compare logic comprises:

output logic circuit coupled to the bit compare logic circuits, the output logic circuit configured to select bit compare logic circuits and provide the indication if the selected bit compare logic circuits are providing the first logic output.

17. The content addressable memory of claim 16, wherein the output logic circuit comprises:

flag select logic configured to select the bit compare logic circuits; and a first logic device coupled to the flag select logic configured to provide the indication if the selected bit compare logic circuits are providing the first logic output.

18. The content addressable memory of claim 14, comprising:

a controller coupled to the compare logic configured to provide a word line address for the same word line.

19. The content addressable memory of claim 15, wherein the second data bits are loaded into the second registers from a source which is external to the magnetic memory.

20. A method of determining if data is stored in memory cells of a magnetic memory, comprising:

providing a first register;

storing first data bits received from the memory cells in the first register;

providing a second register;

storing second data bits in the second register;

comparing first data bits to corresponding second data bits;

providing a first logic output for the corresponding first and second data bits which have the same logic state;

providing a second logic output for the corresponding first and second data bits which do not have the same logic state;

selecting corresponding first and second data bits; and providing the indication if the selected corresponding first and second data bits are all providing the first logic output.

21. The method of claim 20, wherein the indication is an output flag.

22. The method of claim 20, wherein the indication is a word line address for the memory cells which are storing the first data bits.

23. A method of determining if data is stored in memory cells of a magnetic memory, comprising:

providing a first register;

storing first data bits received from the memory cells in the first register;

providing a second register;

storing second data bits in the second register;

comparing first data bits to corresponding second data bits;

providing a first logic output for the corresponding first and second data bits which have the same logic state; and providing a second logic output for the corresponding first and second data bits which do not have the same logic state, wherein storing the second data bits in the second register includes providing the second data bits from a source which is external to the magnetic memory.

24. A method of determining if data is stored in memory cells of a content addressable memory, comprising:

providing first registers;

storing first data bits received from the memory cells in the first registers;

providing second registers;

storing second data bits in the second register;

comparing first data bits to corresponding second data bits in corresponding first and second registers;

providing a first logic output for the corresponding first and second registers in which the first data bits all have the same logic state as the corresponding second data bits; and providing a second logic output for the corresponding first and second registers in which the first data bits do not all have the same logic state as the corresponding second data bits.

25. The method of claim 24, comprising:

selecting corresponding first and second registers; and providing an indication if the selected corresponding first and second registers are providing the first logic output.

26. The method of claim 25, wherein the indication is an output flag.

27. The method of claim 25, wherein the indication is a word line address for the memory cells which are storing the first data bits.

* * * * *